(12) United States Patent
Nakamura

(10) Patent No.: US 8,395,400 B2
(45) Date of Patent: Mar. 12, 2013

(54) TESTING DEVICE AND TESTING METHOD OF SEMICONDUCTOR DEVICES

(75) Inventor: Hideaki Nakamura, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 548 days.

(21) Appl. No.: 12/606,609

(22) Filed: Oct. 27, 2009

(65) Prior Publication Data

US 2010/0040107 A1    Feb. 18, 2010

Related U.S. Application Data

(63) Continuation of application No. PCT/JP2007/060358, filed on May 21, 2007.

(51) Int. Cl.
*G01R 31/10* (2006.01)

(52) U.S. Cl. ......... 324/750.08; 324/750.06; 324/762.01; 374/57; 73/863.11

(58) Field of Classification Search ............ 324/750.08, 324/750.05–750.06, 750.28, 762.01; 374/57; 219/494; 165/253; 73/863.11
See application file for complete search history.

(56) References Cited

U.S. PATENT DOCUMENTS

| | | | |
|---|---|---|---|
| 4,065,936 A * | 1/1978 | Fenton et al. | 62/3.3 |
| 5,327,075 A | 7/1994 | Hashinaga et al. | |
| 5,414,370 A | 5/1995 | Hashinaga et al. | |
| 5,977,785 A * | 11/1999 | Burward-Hoy | 324/750.09 |
| 6,975,028 B1 * | 12/2005 | Wayburn et al. | 257/718 |
| 7,355,428 B2 * | 4/2008 | Kabbani et al. | 324/750.08 |
| 7,870,800 B2 * | 1/2011 | Di Stefano et al. | 73/866.5 |
| 2006/0245161 A1 | 11/2006 | Maruyama et al. | |
| 2008/0238465 A1 * | 10/2008 | Suga et al. | 324/760 |

FOREIGN PATENT DOCUMENTS

| | | |
|---|---|---|
| JP | 5-36793 A | 2/1993 |
| JP | 09-064128 A | 3/1997 |
| JP | 2000-304804 A | 11/2000 |
| JP | 2001-051012 A | 2/2001 |
| JP | 2005-156172 A | 6/2005 |
| JP | 2005-265665 A | 9/2005 |
| JP | 2006-310631 A | 11/2006 |

OTHER PUBLICATIONS

International Search Report of PCT/JP2007/060358, mailing date of Aug. 14, 2007.

* cited by examiner

*Primary Examiner* — Arleen M Vazquez
(74) *Attorney, Agent, or Firm* — Westerman, Hattori, Daniels & Adrian, LLP

(57) ABSTRACT

A testing device of semiconductor devices includes a temperature detector detecting temperatures of semiconductor devices, and a temperature control unit controlling the temperatures of the semiconductor devices based on a detected temperature, in which the temperature control unit includes thermal heads cooling or heating the semiconductor devices, solution pipes through which solutions set to different temperatures flow, and a channel switching part switching whether or not to make the solution flow through the thermal head, and when a test is conducted, the solution flown through the thermal head is switched according to heating amount of the semiconductor device.

17 Claims, 12 Drawing Sheets

F I G. 10A
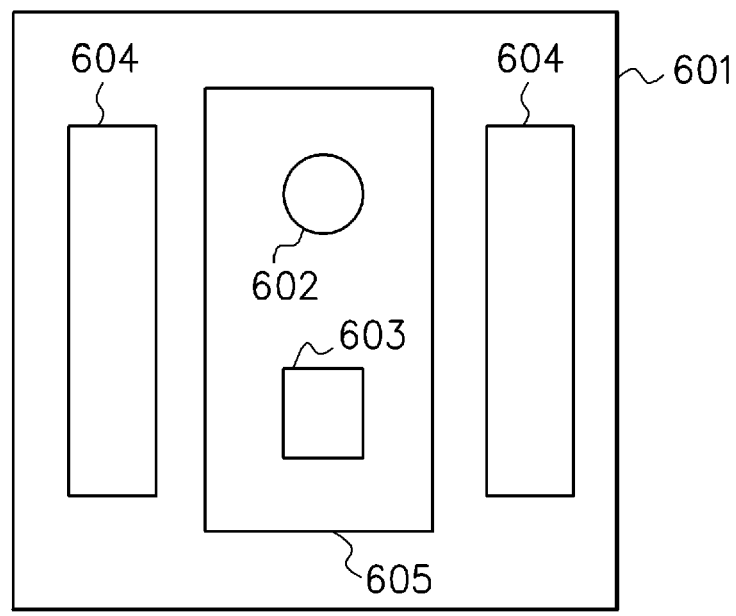
F I G. 10B
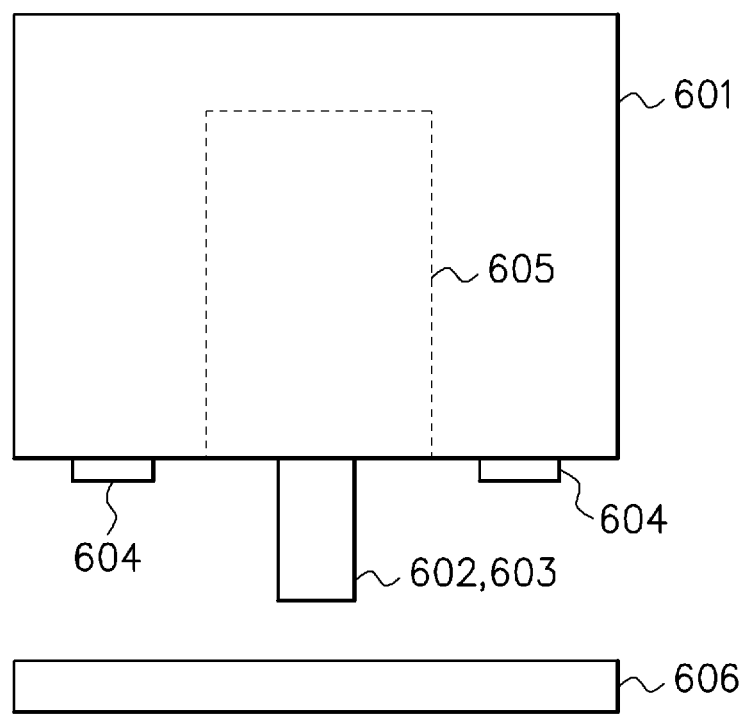

TESTING DEVICE AND TESTING METHOD OF SEMICONDUCTOR DEVICES

CROSS REFERENCE TO RELATED APPLICATIONS

This application is a Continuation of International Application No. PCT/JP2007/060358, with an international filing date of May 21, 2007, which designating the United States of America, the entire contents of which are incorporated herein by reference.

FIELD

The present embodiments discussed herein relates to a testing device and a testing method of semiconductor devices.

BACKGROUND

In order to remove an initial failure, screening is performed on a semiconductor device such as a semiconductor integrated circuit. As currently used screening methods, a method utilizing voltage acceleration and a method utilizing temperature acceleration are cited as typical ones. Generally, if a semiconductor device is used at a room temperature (25° C. to 30° C.), an initial failure is generated during a period of time from the start of its use to almost 1000 hours, and an actual lifetime of the semiconductor device expires after about three hundred thousand hours.

Accordingly, if the screening of the semiconductor device is performed at a room temperature, a long period of time such as almost 1000 hours has to be spent for the screening. Therefore, generally, the screening is normally performed at 125° C. for about 1 to about 96 hours, not for 1000 hours.

A personal computer or a server using semiconductor devices having large heating amounts has a large-sized fin provided on a substrate for restraining a rise in temperatures of the semiconductor devices and for cooling the semiconductor devices, and performs fan cooling, liquid cooling, gas cooling, Peltier cooling and the like. When the screening of the semiconductor devices having large heating amounts is performed, a difference in the heating amounts among each of semiconductor devices is generated due to a manufacturing variation and the like, even under the same voltage and temperature. Depending on the difference in the heating amounts, the temperatures of the semiconductor devices are sometimes out of the regulated temperature control range.

In a conventional testing device that performs the screening, a thermal head having a heater is provided for each of semiconductor devices. When the screening of the semiconductor devices is performed, a solution (water, Fluorinert, or the like) whose temperature may be varied is made to circulate through the thermal heads, and the corresponding thermal heads are placed in contact with all the semiconductor devices, to thereby conduct temperature control of the semiconductor devices through the heat of the solution and the heaters.

Concretely, among semiconductor devices mounted on the testing device, one having the largest heating amount is specified, and a temperature of the solution circulated through the thermal head is set so that a heater power with which the temperature of the semiconductor device reaches a regulated temperature becomes minimum. Specifically, the temperature of the solution is set based on the semiconductor device having the largest heating amount. The other semiconductor devices are controlled so that temperatures thereof reach the regulated temperature, by individually adjusting the heater power.

However, when the variation in the heating amounts among semiconductor devices mounted on the testing device is significantly large, the temperatures of the semiconductor devices are sometimes deviated from a range of the regulated temperature when performing the screening. For instance, if there exists a semiconductor device having a large heating amount whose temperature cannot be controlled to fall within the regulated temperature unless the heater power is set to almost 0% and the temperature of the circulated solution is set to approximately room temperature, the temperature of the semiconductor device having a small heating amount sometimes does not reach the regulated temperature as depicted in FIG. 17, since the generated heat of the semiconductor device is drawn due to the low temperature of the solution, regardless of the heater power which is set to almost 100%.

FIG. 17 is a view for explaining an example of the temperature control of the semiconductor devices when performing the screening. In FIG. 17, a vertical axis represents temperature and a horizontal axis represents time. Further, TR corresponds to a regulated temperature (typical value) when performing the screening, and TRU and TRL correspond to an upper limit value and a lower limit value of the regulated temperature, respectively. As an example, the temperature of the semiconductor device having a large heating amount and the temperature of the semiconductor device having a small heating amount among the semiconductor devices mounted on the testing device are respectively represented by DV11 and DV12.

As depicted in FIG. 17, if the temperature of the circulated solution is lowered so that the temperature of the semiconductor device having a large heating amount (DV11) falls within a range of the regulated temperature, the temperature of the semiconductor device having a small heating amount (DV12) sometimes cannot reach the lower limit value TRL of the regulated temperature because of the insufficient heating amount even when the heater power is set to maximum.

Such a semiconductor device whose temperature is out of the regulated temperature (whose temperature does not reach the regulated temperature within a given set time) is the one to which a regulated stress with which the initial failure is exhibited is not applied, so that the screening has been performed again by cutting off a power supply supplied to the semiconductor device, or the semiconductor device has been handled as a defective product.

Further, various temperature control techniques for performing tests of semiconductor devices have been proposed in Japanese Laid-open Patent Publication No. 2005-265665, Japanese Laid-open Patent Publication No. 2001-51012, Japanese Laid-open Patent Publication No. 2006-310631, Japanese Laid-open Patent Publication No. 2000-304804 and Japanese Laid-open Patent Publication No. 2005-156172.

Japanese Laid-open Patent Publication No. 2005-265665 proposes a burn-in device that makes a heating block for heating an electronic component under test and a cooling block for cooling the electronic component under test in a thermally floating state, and enables to individually control temperatures of electronic components, to thereby simultaneously perform a burn-in test on the large number of electronic components having different self-heating amounts.

Japanese Laid-open Patent Publication No. 2001-51012 proposes a semiconductor testing system that enables to maintain a temperature of an IC device at a certain temperature by controlling a temperature of a contact block in which the IC device is housed. Concretely, there is proposed a temperature control technique in which a hollow portion is provided in the contact block in which the IC device is housed, and a high-temperature control liquid or a low-temperature control liquid is selectively jetted, in accordance with a base temperature of the IC device, to the contact block from a high-temperature control nozzle or a low-temperature control nozzle provided in the hollow portion.

Japanese Laid-open Patent Publication No. 2006-310631 proposes a temperature control technique with which a temperature of a target such as an electronic component can be controlled in an accurate and quick manner by enabling to quickly perform heating processing or cooling processing on the target.

Japanese Laid-open Patent Publication No. 2000-304804 proposes a burn-in device with which temperatures of devices to be measured may be individually controlled and an improvement in temperature accuracy and operability in a burn-in test may be realized.

Japanese Laid-open Patent Publication No. 2005-156172 proposes a test burn-in device that measures and adjusts a temperature of a semiconductor element such as a middle-power and a high-power IC in an element unit, and performs, at the same time, burn-in to exclude a defective product having an initial failure.

SUMMARY

According to an aspect of the embodiments, a test device includes a temperature detector detecting temperatures of a plurality of semiconductor devices for each of the semiconductor devices; and a temperature control unit controlling the temperatures of the semiconductor devices based on a detection result of the temperature detector. The temperature control unit includes thermal heads cooling or heating the semiconductor devices; a plurality of solution pipes through which a plurality of solutions set to mutually different temperatures flow in a parallel manner; and a channel switching part switching whether or not to make the solution flown through the solution pipe flow through the thermal head.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 10A is a lower plan view of the thermal head in the embodiment;

FIG. 10B is a side view of the thermal head in the embodiment;

DESCRIPTION OF EMBODIMENTS

Hereinafter, an embodiment will be described with reference to the drawings.

Figure 1:
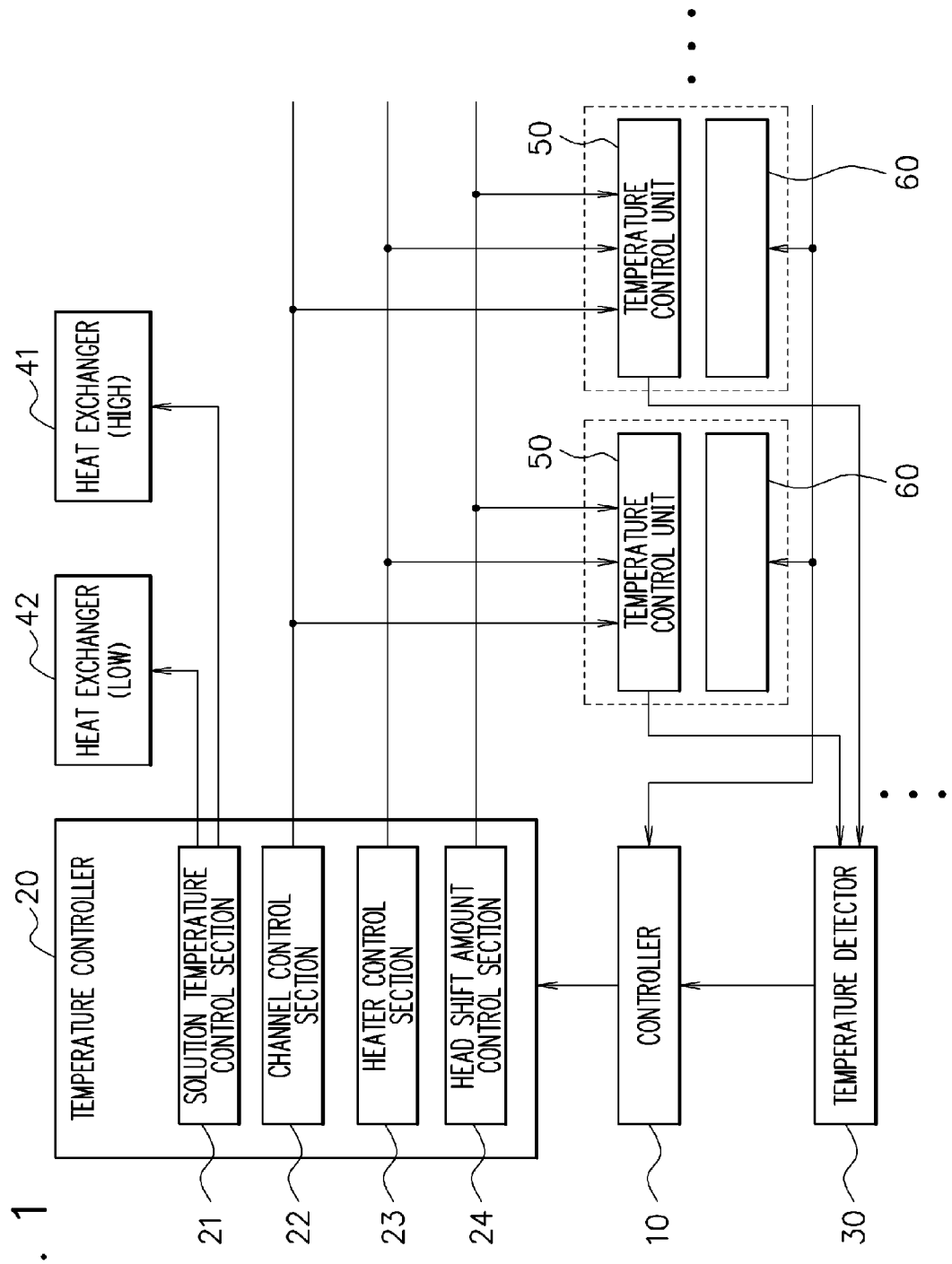
FIG. 1 is a view depicting a structural example of a testing device of semiconductor devices in one embodiment.

FIG. 1 is a block diagram depicting a structural example of a testing device of semiconductor devices in one embodiment. The testing device in the embodiment may perform a test and evaluation of the semiconductor devices by heating or cooling the semiconductor devices to put them under an environment of temperature different from a room temperature, and may be applied to a testing device (burn-in device) or the like that performs screening to remove an initial failure, for instance.

As depicted in FIG. 1, the testing device in the embodiment includes: a controller 10; a temperature controller 20; a temperature detector 30; heat exchangers 41 and 42; temperature control units 50; and test boards 60. One temperature control unit 50 and one test board 60 are set as one pair, and a plurality of pairs of temperature control units 50 and test boards 60 are provided. Note that an illustration of pipes through which a solution whose temperature may be varied and used for temperature control of semiconductor devices (semiconductor devices being test targets) mounted on the test board 60 is circulated, is omitted in FIG. 1.

The controller 10 comprehensively controls respective functional sections in the testing device. For example, the controller 10 gives a control instruction to the temperature controller 20 based on the temperatures (heating amounts) of the semiconductor devices detected by the temperature detector 30. Further, for example, the controller 10 controls voltages and signals applied to the semiconductor devices mounted on the test board 60 during the test, determines, based on the test result and the like, whether or not the semiconductor devices are defective products, and outputs determination results.

The temperature controller 20 controls the heat exchangers 41 and 42, and the temperature control units 50 in accordance with the control instruction from the controller 10, and performs temperature control of the semiconductor devices mounted on the test board 60. The temperature controller 20 includes: a solution temperature control section 21; a channel control section 22; a heater control section 23; and a head shift amount control section 24.

The solution temperature control section 21 controls the heat exchangers 41 and 42, and controls the temperature of solution (water, Fluorinert, or the like) whose temperature may be varied and circulated through the testing device, specifically, through each of the temperature control units 50 for controlling the temperatures of the semiconductor devices. Note that in the embodiment, it is supposed that the two heat exchangers 41 and 42 are provided, and solutions set to different temperatures are circulated, in which the heat exchanger (HIGH) 41 adjusts a temperature of the solution on a high temperature side, and the heat exchanger (LOW) 42 adjusts a temperature of the solution on a low temperature side.

The channel control section 22 controls a channel switching mechanism provided in the temperature control unit 50. The heater control section 23 controls an output of a heater (heater power) provided in a thermal head in the temperature control unit 50. The head shift amount control section 24 controls a shift amount in a longitudinal direction of the thermal head in the temperature control unit 50 (in a normal direction of a surface of the thermal head capable of being brought into contact with the semiconductor device).

The temperature detector 30 detects the temperatures of the semiconductor devices mounted on the test board 60 based on outputs of temperature sensors provided on the thermal heads in the temperature control unit 50. Accordingly, the temperature detector 30 monitors the heating amount of each of the semiconductor devices mounted on the test board 60.

The temperature control unit 50 heats or cools the semiconductor devices mounted on the test board 60 to control the temperatures of the semiconductor devices. The temperature control unit 50 is structured such that the thermal heads are provided so as to correspond to each of the semiconductor devices mounted on the test board 60, and it may independently control the temperature of each of the semiconductor devices. Further, the temperature control unit 50 includes the temperature sensors for measuring the temperatures of the semiconductor devices provided so as to correspond to the respective semiconductor devices mounted on the test board 60.

The test board 60 is a board on which the semiconductor devices to be the test targets are mounted. The test board 60 is electrically connected to the controller 10 when the test is performed, and transmission/reception of signals and the like is performed between the controller 10 and the semiconductor devices via the test board 60.

Figure 2:
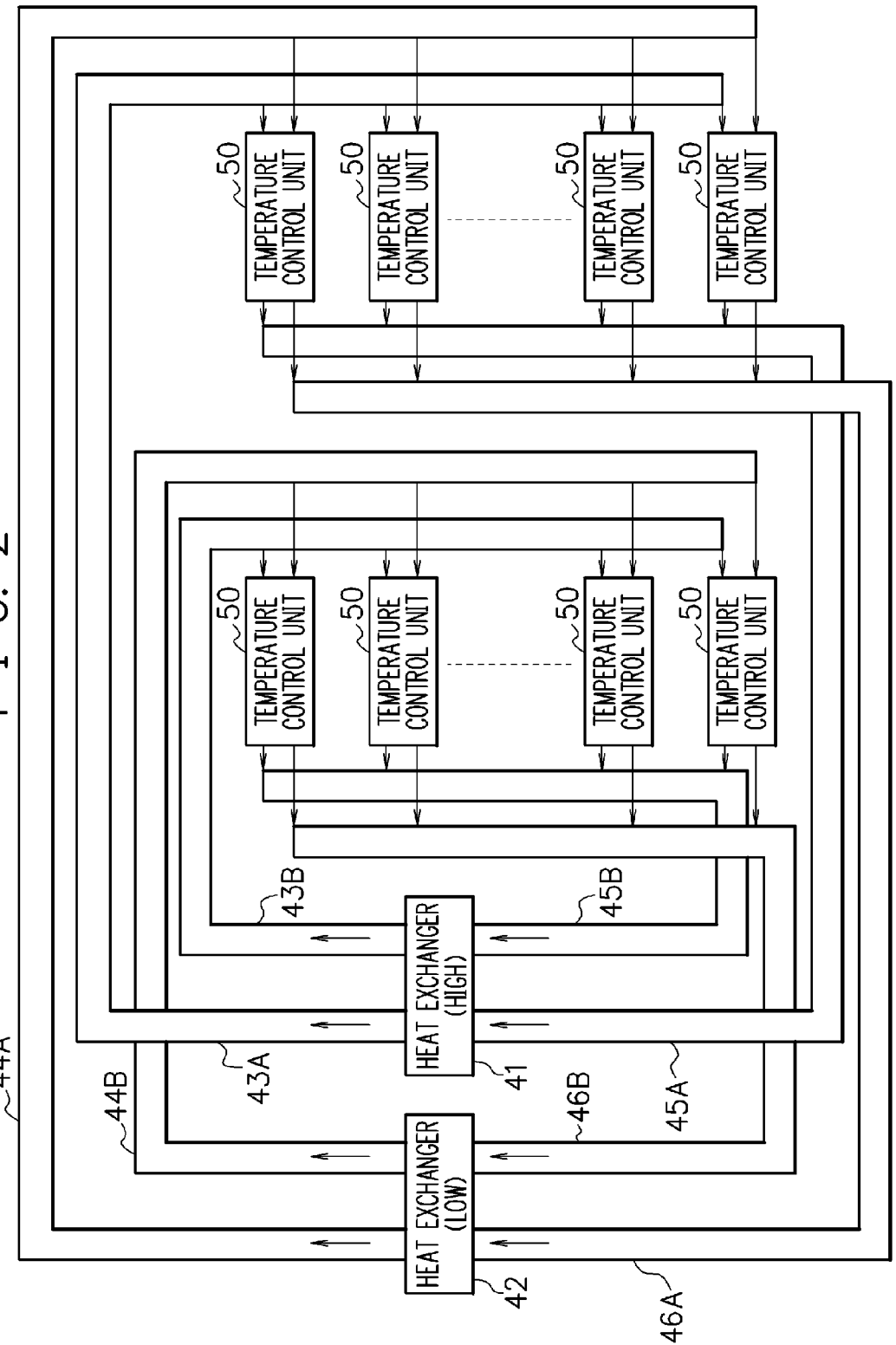
FIG. 2 is a view depicting an example of solution paths in the embodiment.

FIG. 2 is a view depicting an example of paths of solutions circulated through the testing device in the embodiment for controlling the temperatures of the semiconductor devices. As described above, in the testing device in the embodiment, the solutions set to different two types of temperatures are circulated.

The solution whose temperature is adjusted to a set temperature by the heat exchanger (HIGH) 41 flows through solution pipes (high temperature side) 43A and 43B to be supplied to each of the temperature control units 50, and then flows through solution pipes (high temperature side) 45A and 45B to return to the heat exchanger (HIGH) 41.

The solution whose temperature is adjusted to a set temperature by the heat exchanger (LOW) 42 flows through solution pipes (low temperature side) 44A and 44B to be supplied to each of the temperature control units 50, and then flows through solution pipes (low temperature side) 46A and 46B to return to the heat exchanger (LOW) 42.

Accordingly, each of the solution set to have a high side temperature and the solution set to have a low side temperature is circulated through the testing device, and is flown through each of the temperature control units 50.

Figure 3:
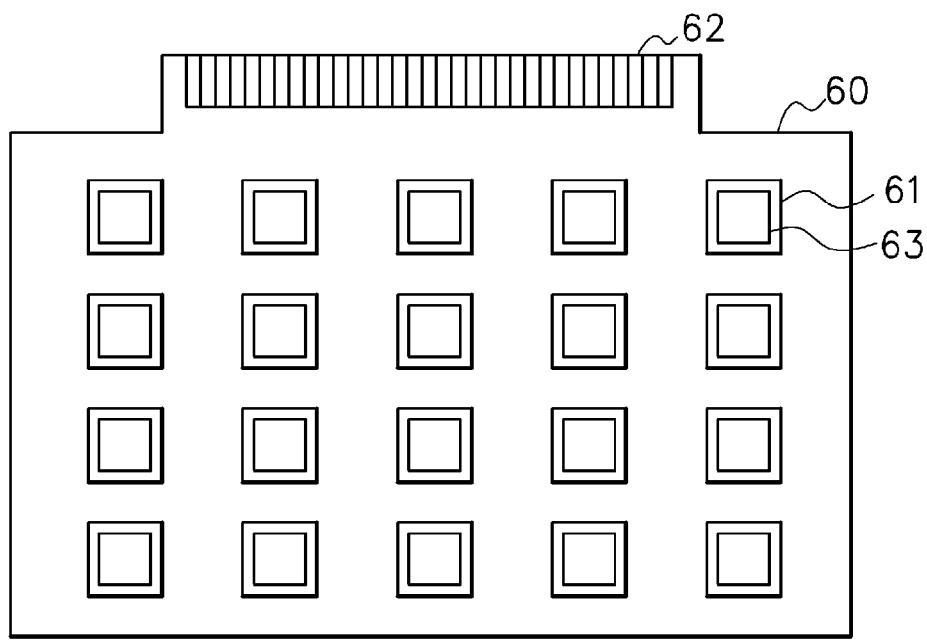
FIG. 3 is a view depicting an example of a test board in the embodiment.

FIG. 3 is a view depicting an example of the test board 60 in the embodiment. A plurality of IC sockets 61 are mounted on the test board 60, and a semiconductor device 63 being the test target is mounted on each of the IC sockets 61. Further, the test board 60 includes terminal groups 62 electrically connected to the IC sockets 61 via not-depicted wirings. The semiconductor devices 63 mounted on the IC sockets 61 on the test board 60 are electrically connected to the controller 10 via the wirings and the terminal groups 62 to perform transmission/reception of signals and the like.

Note that in FIG. 3, an example in which the IC sockets 61 are disposed in a matrix form of 4 rows by 5 columns is depicted, but, the embodiment is not limited to the example. A disposition method and a number of disposition of the IC sockets 61 on the test board 60 may be arbitrarily decided. Further, all the test boards 60 in the testing device are not necessarily structured in the same manner, and, for example, a differently structured test board 60 in which the disposition method, the number of disposition, a size, a shape and the like of the IC sockets 61 are different, may be existed in the testing device in a mixed state.

Figure 4:
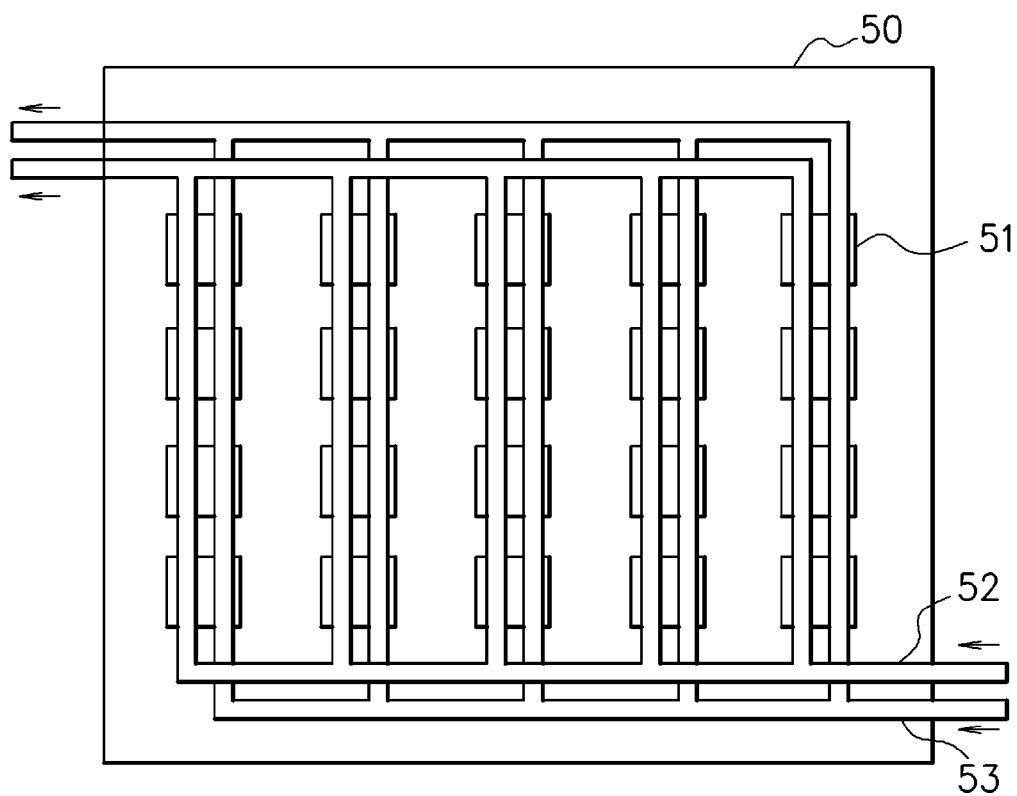
FIG. 4 is a view depicting an example of solution paths in a temperature control unit in the embodiment.

FIG. 4 is a view depicting an example of the paths of the solutions in the temperature control unit 50.

The temperature control unit 50 includes a plurality of thermal heads 51 for heating or cooling the semiconductor devices. The thermal heads 51 are provided so as to correspond to the respective semiconductor devices mounted on the test board 60. Further, the temperature control unit 50 includes a solution pipe (high temperature side) 52 through which the solution set to have the high side temperature is flown and a solution pipe (low temperature side) 53 through which the solution set to have the low side temperature is flown, and is structured to be capable of supplying the solution set to have the high side temperature and the solution set to have the low side temperature to the respective thermal heads 51.

Figure 5A:
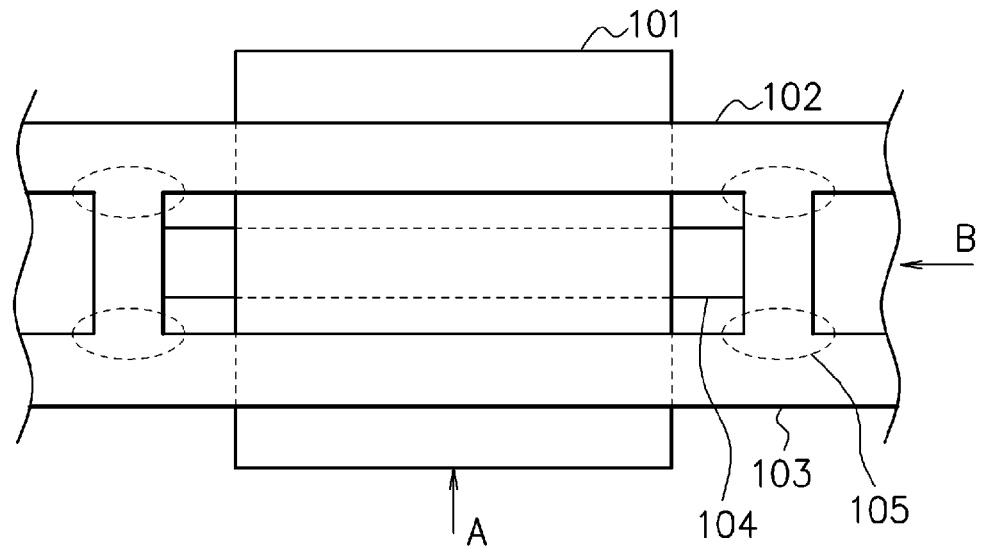
FIG. 5A is an upper plan view depicting a structural example of a thermal head and a peripheral portion thereof in the embodiment.
Figure 5B:
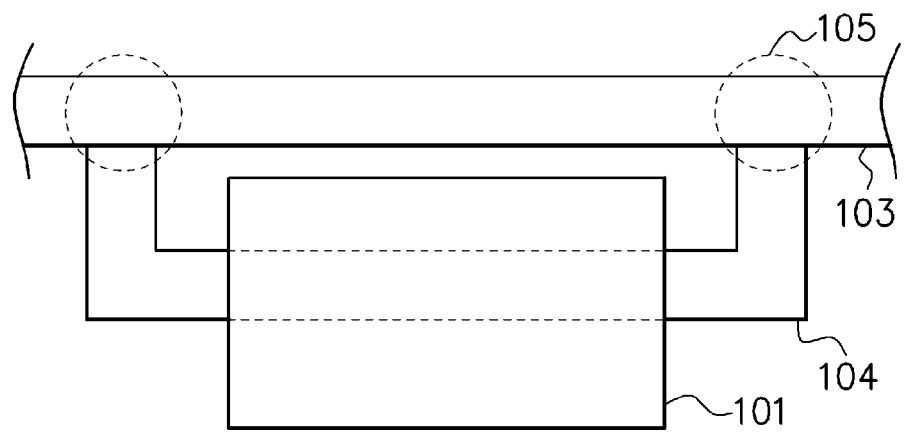
FIG. 5B is a view of the thermal head and the peripheral portion thereof seen from the arrow A in FIG. 5A.
Figure 5C:
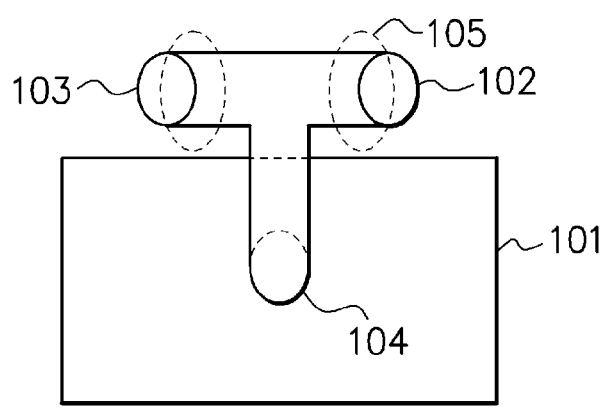
FIG. 5C is a view of the thermal head and the peripheral portion thereof seen from the arrow B in FIG. 5A.

A structural example of the thermal head and a peripheral portion thereof in the embodiment is depicted in FIG. 5A to FIG. 5C. FIG. 5A is an upper plan view depicting the structural example of the thermal head and the peripheral portion thereof, FIG. 5B is a view seen from the arrow A according to FIG. 5A, and FIG. 5C is a view seen from the arrow B according to FIG. 5A.

In FIG. 5A to FIG. 5C, 101 denotes a thermal head, 102 denotes a solution pipe (high temperature side) through which the solution set to have the high side temperature is flown, 103 denotes a solution pipe (low temperature side) through which the solution set to have the low side temperature is flown, and 104 denotes a solution pipe for making the solution pass through the thermal head 101. The solution pipe (high temperature side) 102 corresponds to the solution pipe (high temperature side) 52 depicted in FIG. 4, and the solution pipe (low temperature side) 103 corresponds to the solution pipe (low temperature side) 53 depicted in FIG. 4.

A channel switching mechanism 105 is provided at each of a connection portion between the solution pipe (high temperature side) 102 and the solution pipe 104 and a connection portion between the solution pipe (low temperature side) 103 and the solution pipe 104. With the use of the channel switching mechanisms 105, it is possible to switch whether or not to make the solution circulate through the thermal head 101, namely, it is possible to control whether to open or close the channel of the solution with respect to the thermal head 101.

In the structure depicted in FIG. 5A to FIG. 5C, the solution set to have the high side temperature or the solution set to have the low side temperature may be selectively flown through the thermal head 101 by the channel switching mechanisms 105. Note that it is also possible to design such that neither the solution set to have the high side temperature nor the solution set to have the low side temperature is flown through the thermal head 101 by controlling the respective channel switching mechanisms 105 to close the channel of the solution with respect to the thermal head 101.

Figure 6A:
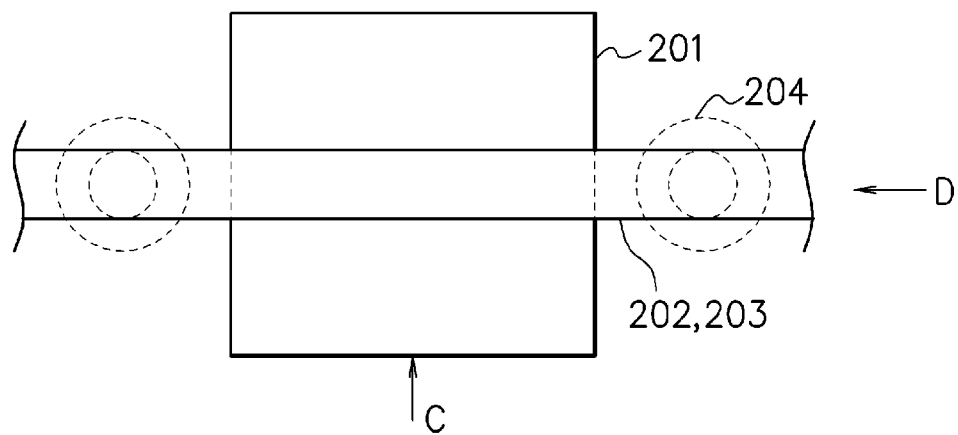
FIG. 6A is an upper plan view depicting another structural example of the thermal head and the peripheral portion thereof in the embodiment.
Figure 6B:
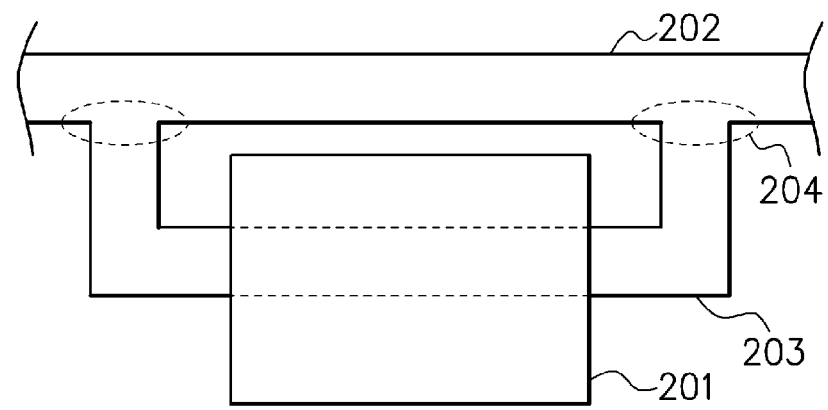
FIG. 6B is a view of the thermal head and the peripheral portion thereof seen from the arrow C in FIG. 6A.
Figure 6C:
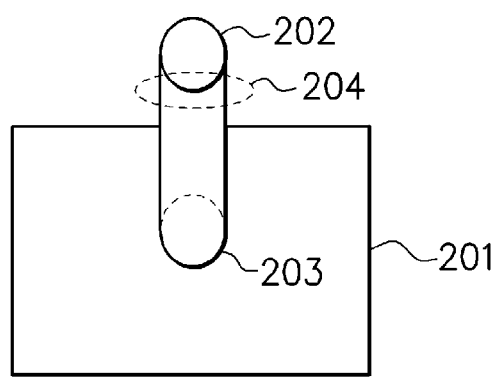
FIG. 6C is a view of the thermal head and the peripheral portion thereof seen from the arrow D in FIG. 6A.

Note that in FIG. 5A to FIG. 5C, the structure in which the solution set to have the high side temperature or the solution set to have the low side temperature is selectively flown through the thermal head 101 is depicted, but, it is also possible to design such that the temperature control of the semiconductor devices is conducted by making a solution of one type of temperature set to a certain temperature circulate through the testing device and by switching whether or not to make the solution flow through the thermal head 101 under a structure depicted in FIG. 6A to FIG. 6C.

FIG. 6A to FIG. 6C are views depicting another structural example of the thermal head and the peripheral portion thereof in the embodiment. FIG. 6A is an upper plan view, FIG. 6B is a view seen from the arrow C according to FIG. 6A, and FIG. 6C is a view seen from the arrow D according to FIG. 6A.

In FIG. 6A to FIG. 6C, 201 denotes a thermal head, 202 denotes a solution pipe for making the solution circulate through the testing device, and 203 denotes a solution pipe for making the solution pass through the thermal head 201. Channel switching mechanisms 204 for switching whether or not to make the solution circulate through the thermal head 201, namely, for controlling whether to open or close a channel of the solution with respect to the thermal head 201, are provided at connection portions between the solution pipe 202 and the solution pipe 203. Accordingly, it is possible to make the solution flow through the thermal head 201 or to block the flow of the solution.

The channel switching mechanism in the embodiment will be described. Note that hereinbelow, an explanation will be given by indicating one solution pipe for making the solution circulate through the testing device and a solution pipe for making the solution pass through the thermal head, but, in the structure depicted in FIG. 5A to FIG. 5C, it is applied the channel switching mechanism described hereinafter to each of the solution pipes for making the solution circulate through the testing device.

Figure 7:
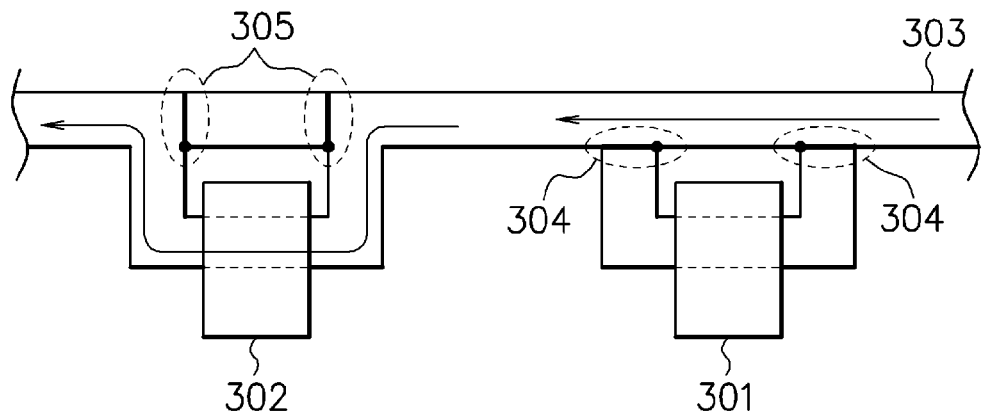
FIG. 7 is a view depicting an example of channel switching mechanisms in the embodiment.

FIG. 7 is a view depicting an example of the channel switching mechanisms in the embodiment.

In FIG. 7, 301 and 302 denote thermal heads, in which it is supposed that a semiconductor device corresponding to the thermal head 301 has a small heating amount, and a semiconductor device corresponding to the thermal head 302 has a large heating amount. At connection portions between a solution pipe 303 for making the solution circulate through the testing device and solution pipes for making the solution pass through the thermal heads 301 and 302, control valves 304 and 305 that switch whether or not to make the solution flow through the thermal heads 301 and 302 are provided. The control valves 304 and 305 are controlled by the channel control section 22 in the temperature controller 20.

When the solution is not flown through the thermal heads 301 and 302, the control valves are controlled to close connection paths between the solution pipe 303 and the solution pipe for making the solution pass through the thermal head, as depicted by the control valves 304. Meanwhile, when the solution is flown through the thermal heads 301 and 302, the control valves are controlled to close a path of the solution pipe 303 so that the solution is flown from the solution pipe 303 through the solution pipe for making the solution pass through the thermal head, as depicted by the control valves 305.

Figure 8:
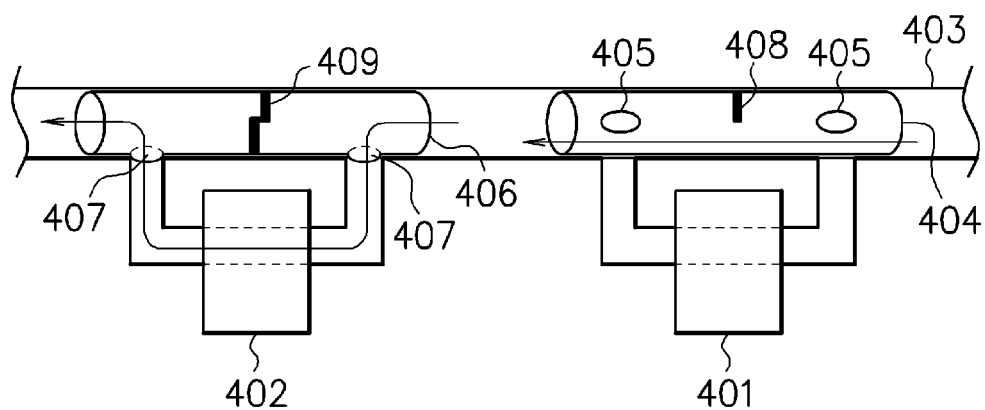
FIG. 8 is a view depicting another example of the channel switching mechanisms in the embodiment.

FIG. 8 is a view depicting another example of the channel switching mechanisms in the embodiment.

In FIG. 8, 401 and 402 denote thermal heads, in which it is supposed that a semiconductor device corresponding to the thermal head 401 has a small heating amount, and a semiconductor device corresponding to the thermal head 402 has a large heating amount. At connection portions between a solution pipe 403 for making the solution circulate through the testing device and solution pipes for making the solution pass through the thermal heads 401 and 402, cylindrical members 404 and 406 which are rotatable and brought into contact with an inner wall of the solution pipe 403 are provided.

The members 404 and 406 include openings 405 and 407. The openings 405 and 407 are provided to be aligned with solution pipes for making the solution pass through the thermal heads 401 and 402 when the members 404 and 406 are rotated by proper angles. Further, inside the members 404 and 406, shielding portions 408 and 409 with which flow paths in the members 404 and 406 are closed when the members 404 and 406 are rotated to align the solution pipes for making the solution pass through the thermal heads 401 and 402 with the openings 405 and 407, and the flow paths in the members 404 and 406 are opened in the other cases. Rotation amounts of the members 404 and 406 are controlled by the channel control section 22 in the temperature controller 20.

When the solution is not flown through the thermal heads 401 and 402, it is controlled not to align the openings 405 with the solution pipe for making the solution pass through the thermal head, as depicted by the member 404. Meanwhile, when the solution is flown through the thermal heads 401 and 402, it is controlled to align the openings 407 with the solution pipe for making the solution pass through the thermal head, as depicted by the member 406.

Figure 9:
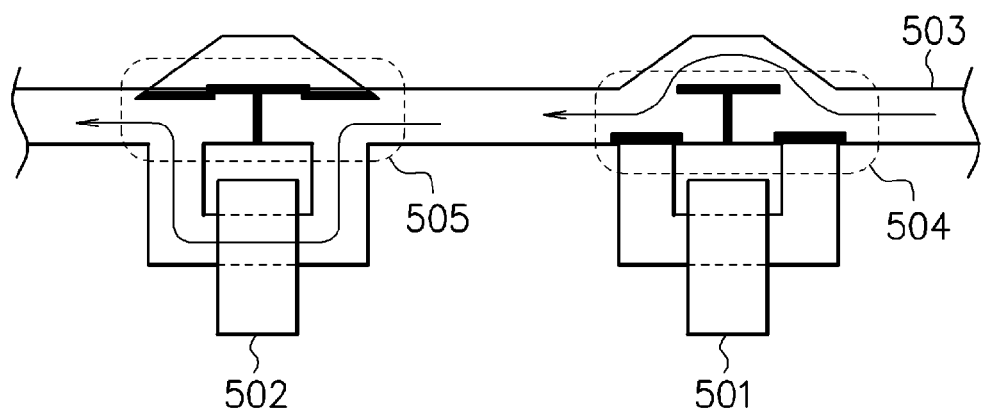
FIG. 9 is a view depicting another example of the channel switching mechanisms in the embodiment.

FIG. 9 is a view depicting another example of the channel switching mechanisms in the embodiment.

In FIG. 9, 501 and 502 denote thermal heads, in which it is supposed that a semiconductor device corresponding to the thermal head 501 has a small heating amount, and a semiconductor device corresponding to the thermal head 502 has a large heating amount. At connection portions between a solution pipe 503 for making the solution circulate through the testing device and solution pipes for making the solution pass through the thermal heads 501 and 502, control valves 504 and 505 that switch whether or not to make the solution flow through the thermal heads 501 and 502 are provided. The control valves 504 and 505 are controlled by the channel control section 22 in the temperature controller 20.

When the solution is not flown through the thermal heads 501 and 502, the control valve is controlled to close connection paths between the solution pipe 503 and the solution pipe for making the solution pass through the thermal head, as depicted by the control valve 504. Meanwhile, when the solution is flown through the thermal heads 501 and 502, the control valve is controlled to close a path of the solution pipe 503 so that the solution is flown from the solution pipe 503 through the solution pipe for making the solution pass through the thermal head, as depicted by the control valve 505.

A structural example of the thermal head in the embodiment is depicted in FIG. 10A and FIG. 10B. FIG. 10A is a lower plan view of the thermal head, and FIG. 10B is a side view of the thermal head. Note that an illustration of solution pipes for making the solution pass through the thermal head is omitted in FIG. 10A and FIG. 10B.

In FIG. 10A and FIG. 10B, 601 denotes a thermal head, 602 denotes a heater that applies heat to a semiconductor device 606, 603 denotes a temperature sensor that measures a temperature of the semiconductor device 606, and 604 denotes a solution temperature transmitting sheet. The heater 602 and the temperature sensor 603 are fixed to a block 605 different from a block to which the solution temperature transmitting sheet 604 is fixed.

Each of the block to which the solution temperature transmitting sheet 604 is fixed and the block 605 to which the heater 602 and the temperature sensor 603 are fixed may independently adjust its shift amount in a longitudinal direction. For example, a drive mechanism (cam, air cylinder, or the like) for shifting the block to which the solution temperature transmitting sheet 604 is fixed and a drive mechanism for shifting the block 605 to which the heater 602 and the temperature sensor 603 are fixed are respectively provided, and when the drive mechanisms are controlled by the head shift amount control section 24 in the temperature controller 20, the shift amounts of the blocks are adjusted. Note that the adjustment of the shift amounts may be independently conducted for each of the thermal heads.

Figure 11A:
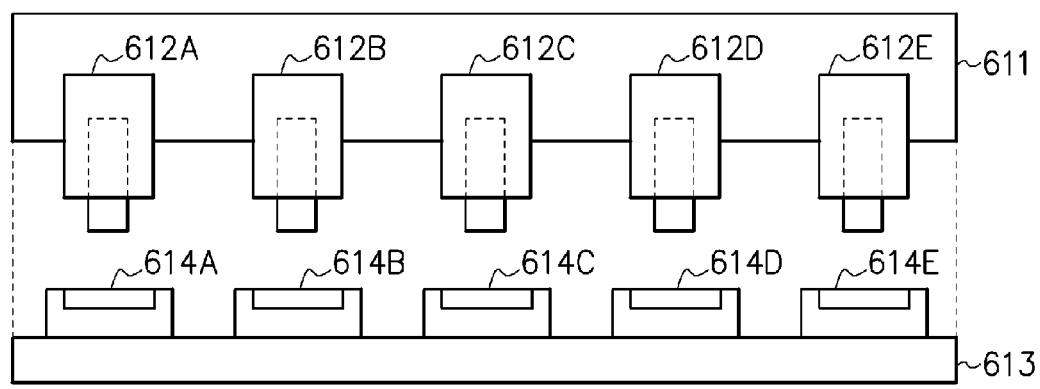
FIG. 11A is a view for explaining shift control of the thermal heads in the embodiment.

Shift control of the thermal heads in the embodiment will be explained with reference to FIG. 11A and FIG. 11B. FIG. 11A depicts an idle state in which the test is not executed in the testing device, and FIG. 11B depicts a state at the time of the test during which the test is executed.

Figure 11B:
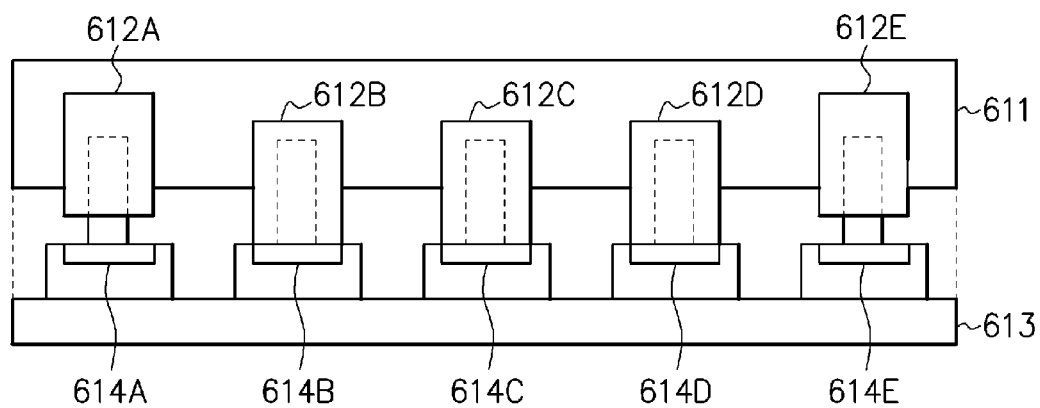
FIG. 11B is a view for explaining the shift control of the thermal heads in the embodiment.

In FIG. 11A and FIG. 11B, 611 denotes a temperature control unit in which thermal heads 612A to 612E are provided. Further, 613 denotes a test board on which semiconductor devices 614A to 614E are mounted. Here, the semiconductor devices 614A and 614E are supposed to have smaller heating amounts than the semiconductor devices 614B, 614C, and 614D at the time of the test.

When the test is conducted in the testing device, the thermal heads 612A to 612E are first shifted so that both the block to which the solution temperature transmitting sheet is fixed and the block to which the heater and the temperature sensor are fixed are brought into contact with the semiconductor devices 614A to 614E. Subsequently, when the semiconductor device has a small heating amount and a temperature thereof does not reach a regulated temperature within a given set time, or when such a situation may be predicted, the blocks to which the solution temperature transmitting sheets are fixed are raised to be in a state of not being brought into contact with the semiconductor devices 614A and 614E, as depicted by the thermal heads 612A and 612E in FIG. 11B. As above, by preventing an excessive heat from being drawn from the semiconductor devices, it is possible to reduce a temperature variation of the semiconductor devices at the time of the test.

Note that in the above description, the heater and the temperature sensor are fixed to the block different from the block to which the solution temperature transmitting sheet is fixed, but, it is also possible to design such that the solution temperature transmitting sheet, the heater, and the temperature sensor are provided on one block, and protrusion amounts of the heater and the temperature sensor are adjusted. In this case, it is adjusted the shift amount of the thermal head in the longitudinal direction so that a first state in which all the solution temperature transmitting sheet, the heater, and the temperature sensor are brought into contact with the semiconductor device, a second state in which not the solution temperature transmitting sheet but the heater and the temperature sensor are brought into contact with the semiconductor device, and a third state in which all the solution temperature transmitting sheet, the theater, and the temperature sensor are not brought into contact with the semiconductor device, may be realized.

Next, an operation of the testing device in the embodiment will be described.

Figure 12:
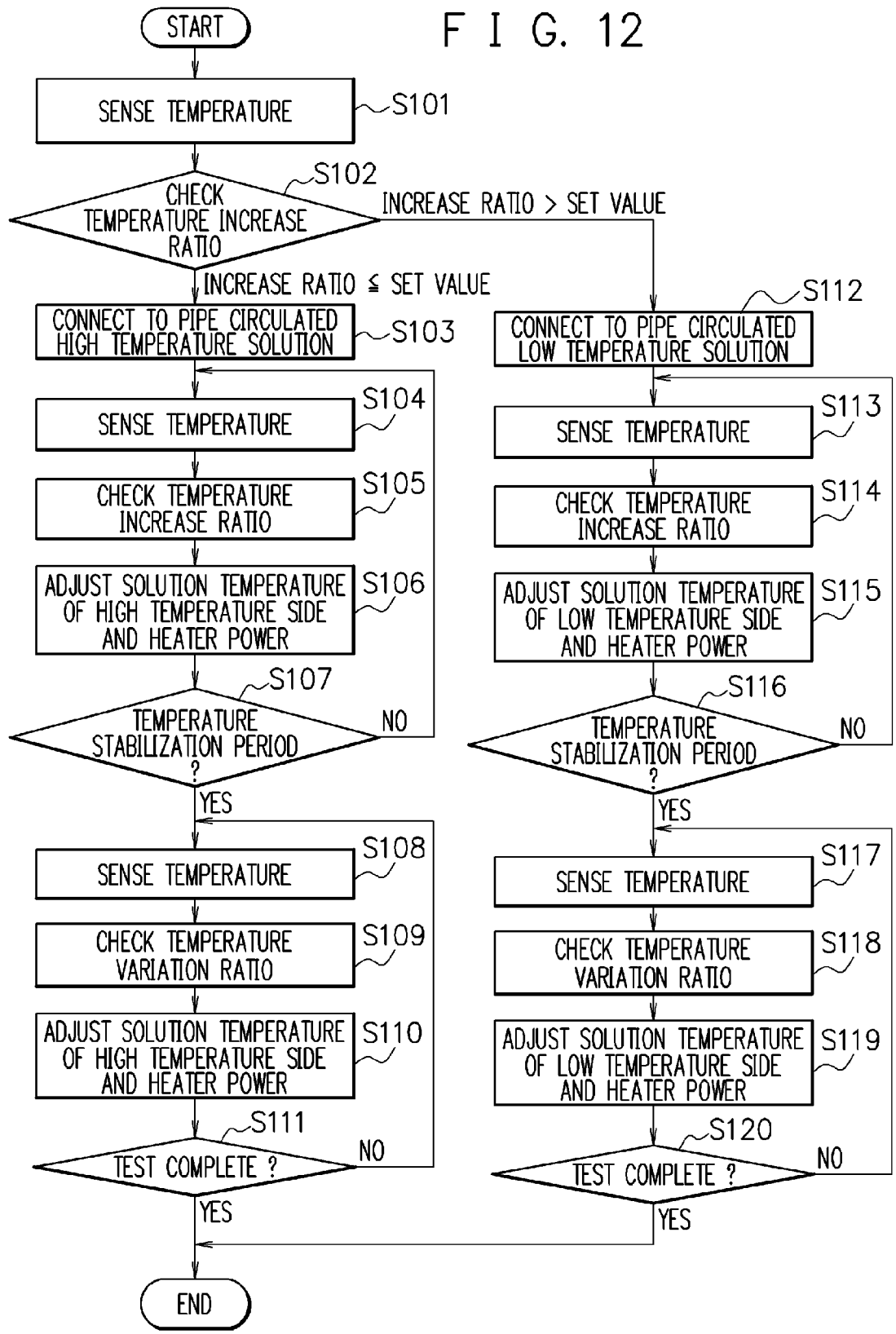
FIG. 12 is a flow chart depicting an operation of the testing device in the embodiment.

FIG. 12 is a flow chart depicting a temperature control operation in the testing device in the embodiment. Note that FIG. 12 depicts an operation in which the temperature control of the semiconductor devices is performed using solutions set to two types of different temperatures.

Firstly, when the operation is started, the controller 10 obtains a temperature (heating amount) of the semiconductor device detected by the temperature detector 30 (S101). Next, the controller 10 checks, based on the obtained temperature of the semiconductor device, a temperature increase ratio at the time when the temperature is increased (S102).

As a result of this, when the temperature increase ratio is equal to or less than a given set value, namely, when the heating amount of the semiconductor device is small, the process proceeds to step S103. Subsequently, the channel control section 22 in the temperature controller 20 controls, based on the control instruction from the controller 10, the channel switching mechanisms to connect the solution pipe through which the solution set to have the high side temperature is circulated and the solution pipe for making the solution pass through the thermal head so that the solution may be flown through the pipes (S103).

Next, the controller 10 obtains a temperature (heating amount) of the semiconductor device detected by the temperature detector 30 (S104) and checks a temperature increase ratio based on the obtained temperature of the semiconductor device (S105). Subsequently, based on the control instruction from the controller 10 in accordance with the checked temperature increase ratio, the solution temperature control section 21 in the temperature controller 20 controls the heat exchanger (HIGH) 41 to perform the temperature adjustment of the high temperature side solution, and the heater control section 23 adjusts the heater power of the thermal head (S106).

Next, the controller 10 determines, based on the temperature (heating amount) of the semiconductor device detected by the temperature detector 30, whether or not the temperature reached a period of temperature stabilization (S107). As a result of this, when it is determined that the temperature did not reach the period of temperature stabilization, namely, the temperature is increasing (NO in S107), the process goes back to step S104. Accordingly, the operations of steps S104 to S107 are repeatedly conducted until the controller 10 determines that the temperature reached the period of temperature stabilization.

Meanwhile, when it is determined that the temperature reached the period of temperature stabilization (YES) as a result of the determination in step S107, the controller 10 obtains a temperature (heating amount) of the semiconductor device detected by the temperature detector 30 (S108), and checks a temperature variation ratio based on the obtained temperature of the semiconductor device (S109). Subsequently, based on the control instruction from the controller 10 in accordance with the checked temperature variation ratio, the solution temperature control section 21 in the temperature controller 20 controls the heat exchanger (HIGH) 41 to perform the temperature adjustment of the high temperature side solution, and the heater control section 23 adjusts the heater power of the thermal head (S110).

The operations of steps S108 to S110 are repeatedly conducted until the test is completed, and when the test is completed (YES in step S111), the temperature control operation is terminated.

As a result of the check for the temperature increase ratio in step S102, when the temperature increase ratio is equal to or more than the given set value, namely, when the heating amount of the semiconductor device is large, the process proceeds to step S112. Subsequently, the channel control section 22 in the temperature controller 20 controls, based on the control instruction from the controller 10, the channel switching mechanisms to connect the solution pipe through which the solution set to have the low side temperature is circulated and the solution pipe for making the solution pass through the thermal head so that the solution may be flown through the pipes (S112).

Operations of steps S113 to S120 are the same as those of the aforementioned steps S104 to S111 except that the heat exchanger (LOW) 42 is controlled to perform the temperature adjustment of the low temperature side solution when conducting the temperature adjustment of the solution, so that an explanation thereof will be omitted hereinafter.

Figure 13:
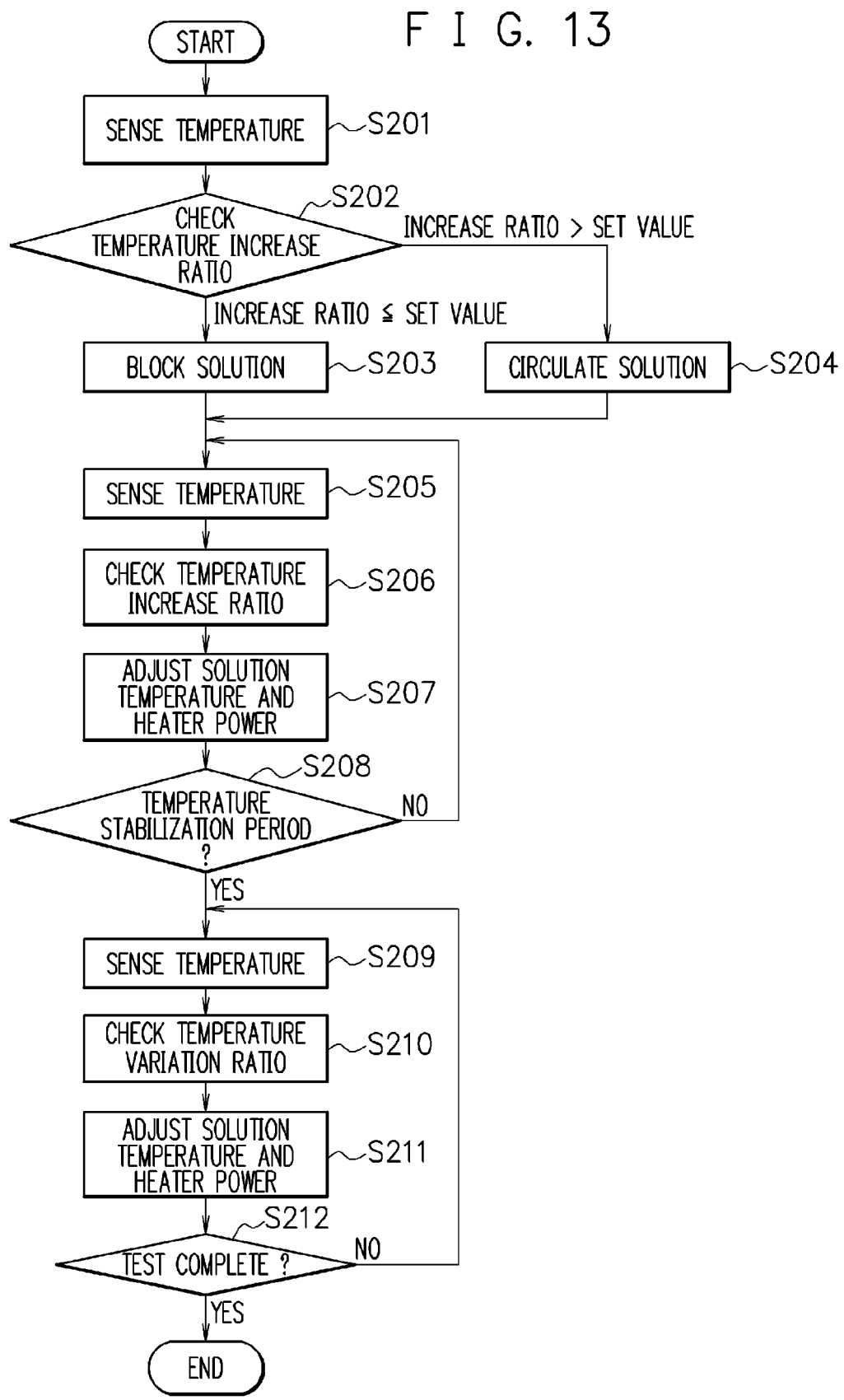
FIG. 13 is a flow chart depicting the operation of the testing device in the embodiment.

FIG. 13 is a flow chart depicting a temperature control operation in the testing device in the embodiment. Note that FIG. 13 depicts an operation when the temperature control of the semiconductor devices is performed by switching whether or not to make the solution flow through the thermal heads.

Firstly, when the operation is started, the controller 10 obtains a temperature (heating amount) of the semiconductor device detected by the temperature detector 30 (S201), and checks, based on the obtained temperature of the semiconductor device, a temperature increase ratio at the time when the temperature is increased (S202).

As a result of this, when the temperature increase ratio is equal to or less than a given set value, namely, when the heating amount of the semiconductor device is small, the process proceeds to step S203. Subsequently, the channel control section 22 in the temperature controller 20 controls, based on the control instruction from the controller 10, the channel switching mechanisms not to connect the solution pipe for making the solution circulate through the testing device and the solution pipe for making the solution pass through the thermal head, namely, not to supply the solution through the thermal head (S203).

Meanwhile, when the temperature increase ratio is equal to or more than the given set value, namely, when the heating amount of the semiconductor device is large, the process proceeds to step S204. Subsequently, the channel control section 22 in the temperature controller 20 controls, based on the control instruction from the controller 10, the channel switching mechanisms to connect the solution pipe for making the solution circulate through the testing device and the solution pipe for making the solution pass through the thermal head so that the solution may be flown through the pipes (S204).

Next, the controller 10 obtains a temperature (heating amount) of the semiconductor device detected by the temperature detector 30 (S205) and checks a temperature increase ratio based on the obtained temperature of the semiconductor device (S206). Subsequently, based on the control instruction from the controller 10 in accordance with the checked temperature increase ratio, the solution temperature control section 21 in the temperature controller 20 controls the heat exchanger to perform the temperature adjustment of the solution, and the heater control section 23 adjusts the heater power of the thermal head (S207).

Next, the controller 10 determines, based on the temperature (heating amount) of the semiconductor device detected by the temperature detector 30, whether or not the temperature reached a period of temperature stabilization (S208). As a result of this, when it is determined that the temperature did not reach the period of temperature stabilization, namely, the temperature is increasing (NO in S208), the process goes back to step S205. Accordingly, the operations of steps S205 to S208 are repeatedly conducted until the controller 10 determines that the temperature reached the period of temperature stabilization.

Meanwhile, when it is determined that the temperature reached the period of temperature stabilization (YES) as a result of the determination in step S208, the controller 10 obtains a temperature (heating amount) of the semiconductor device detected by the temperature detector 30 (S209), and checks a temperature variation ratio based on the obtained temperature of the semiconductor device (S210). Subsequently, based on the control instruction from the controller 10 in accordance with the checked temperature variation ratio, the solution temperature control section 21 in the temperature controller 20 controls the heat exchanger to perform the temperature adjustment of the solution, and the heater control section 23 adjusts the heater power of the thermal head (S211).

The operations of steps S209 to S211 are repeatedly conducted until the test is completed, and when the test is completed (YES in step S212), the temperature control operation is terminated.

Note that FIG. 12 and FIG. 13 depict a case in which the channel switch is performed before the test is executed as an example, but, the channel switch may also be performed at any timing during the execution of the test.

Further, in the embodiment, the temperature control of the semiconductor devices may be conducted also by adjusting the shift amounts of the thermal heads in the longitudinal direction, and in the temperature control operation of the semiconductor devices through the shift control of the thermal heads, it is designed such that the shift amounts of the thermal heads are adjusted in steps S203 and S204 in the flow chart depicted in FIG. 13, for example. Concretely, a position of the thermal head is adjusted so that the solution temperature transmitting sheet is in a state of not being brought into contact with the semiconductor device in step S203, and the position of the thermal head is adjusted so that the solution temperature transmitting sheet is brought into contact with the semiconductor device in step S204.

As described above, according to the embodiment, even if there is a difference in the heating amounts due to the manufacturing variation and the like of the semiconductor devices to be the test targets, it is possible to favorably control the temperatures of the semiconductor devices and to reduce the temperature variation of the semiconductor devices. For example, when the variation in the heating amounts is large, and even if there is a semiconductor device having a small heating amount and its temperature could not have reached the regulated temperature in the past when the solution temperature was controlled to make a temperature of a semiconductor device having a large heating amount fall within a range of the regulated temperature, it becomes possible to control the temperature of the semiconductor device having a small heating amount to fall within the range of the regulated temperature, as depicted in FIG. 14.

Figure 14:
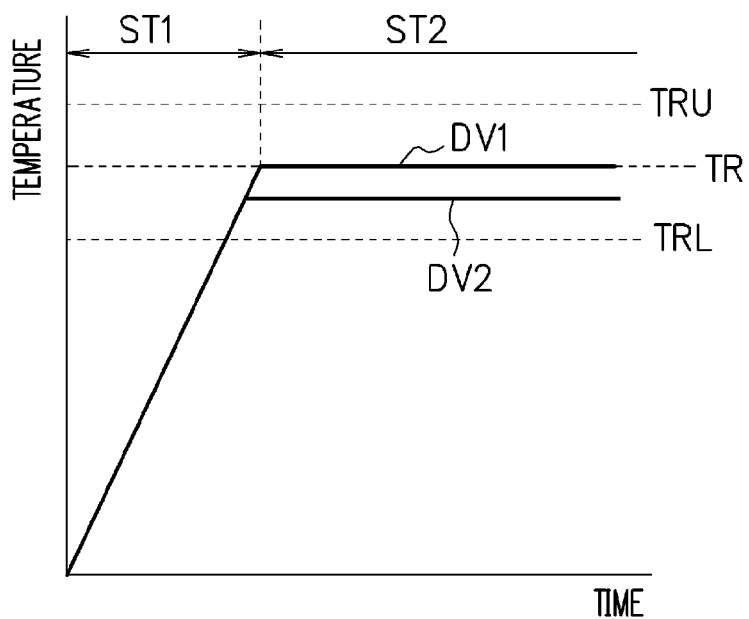
FIG. 14 is a view for explaining temperature control in the embodiment.

FIG. 14 is a view depicting an example of temperature control of the semiconductor devices performed by the testing device in the embodiment. In FIG. 14, a vertical axis represents temperature and a horizontal axis represents time. As an example, the temperature of the semiconductor device having a large heating amount and the temperature of the semiconductor device having a small heating amount among the semiconductor devices mounted on the testing device are respectively represented by DV1 and DV2.

TR corresponds to a regulated temperature (typical value) of the semiconductor devices when the test is performed, and TRU and TRL correspond to an upper limit value and a lower limit value of the regulated temperature, respectively. Further, ST1 is a period of time during which the temperature increases, and ST2 is a period of time during which the temperature is stabilized.

According to the embodiment, even if there is the semiconductor device having a small heating amount and its temperature could not have reached the regulated temperature in the past when the solution temperature was lowered to make the temperature of the semiconductor device having a large heating amount (DV1) fall within the range of the regulated temperature, and when the temperature of the semiconductor device having a small heating amount does not reach the regulated temperature within the set time or when such a situation is predicted, by switching the solution flown through the thermal head to a solution at a high side temperature or by blocking the flow of the solution through the thermal head to prevent an excessive heat from being drawn from the semiconductor device, it becomes possible to control the temperature of the semiconductor device having a small heating amount to fall within the range of the regulated temperature, as depicted by DV2 in FIG. 14. Therefore, the screening may be simultaneously performed on the semiconductor devices on which the simultaneous screening could not have performed in the past due to the difference in the heating amounts, which eliminates a chance to perform the screening again and to handle the semiconductor devices as defective products. Accordingly, it is possible to improve a test efficiency and to reduce a defect ratio.

Figure 15:
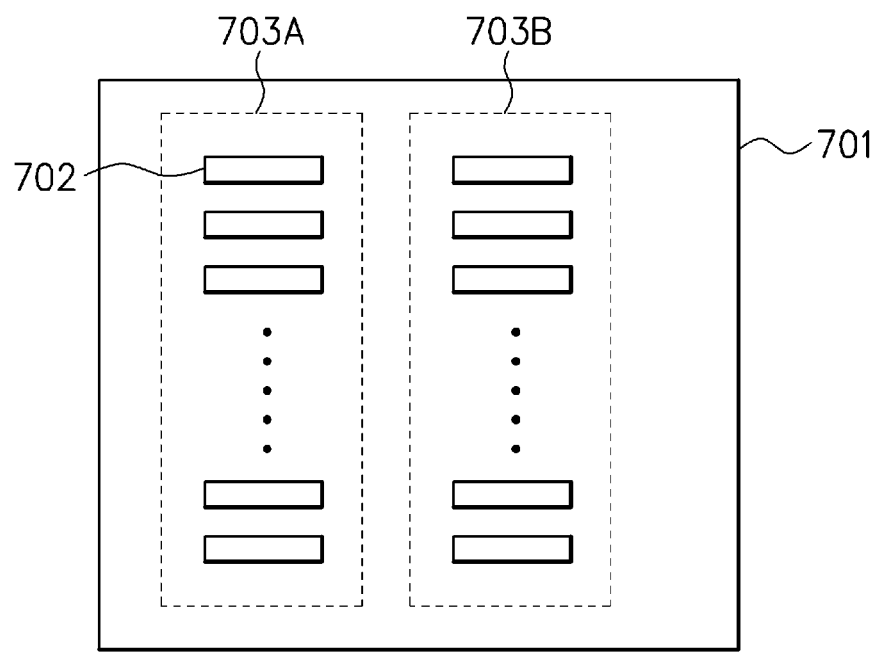
FIG. 15 is a view for explaining a unit per which the temperature control is performed in the embodiment.

Note that the selection of the solutions flown through the thermal head, in other words, the control of the channel switching mechanism may be conducted for each of the semiconductor devices or for each of the test boards (temperature control units). Further, the control of the channel switching mechanism may be conducted for each of pairs (ZONES) 703A and 703B each formed of a plurality of test boards 702 in a testing device 701 as depicted in FIG. 15, or for each of semiconductor device groups each formed of a plurality of semiconductor devices.

Further, if a grouping of the semiconductor devices having large heating amounts and the semiconductor devices having small heating amounts is available even though the variation in the heating amounts is large, by enabling to control, only before the test, a first zone 703A and a second zone 703B to be a zone for high heat generation and a zone for low heat generation, respectively, for instance, without conducting the temperature detection (monitoring of the heating amounts) of the semiconductor devices, it becomes possible to reduce the manufacturing cost of the testing device.

Further, in the aforementioned embodiment, when solutions having a plurality of temperatures are circulated through the testing device, the solutions having two temperatures of high temperature side and low temperature side are made to circulate, but, the embodiment is not limited to the example, and solutions having three types or more of different temperatures may also be made to circulate, in which each of the channel switching mechanisms is provided so that it may control to flow/block the solutions having the respective temperatures through the thermal heads.

Figure 16:
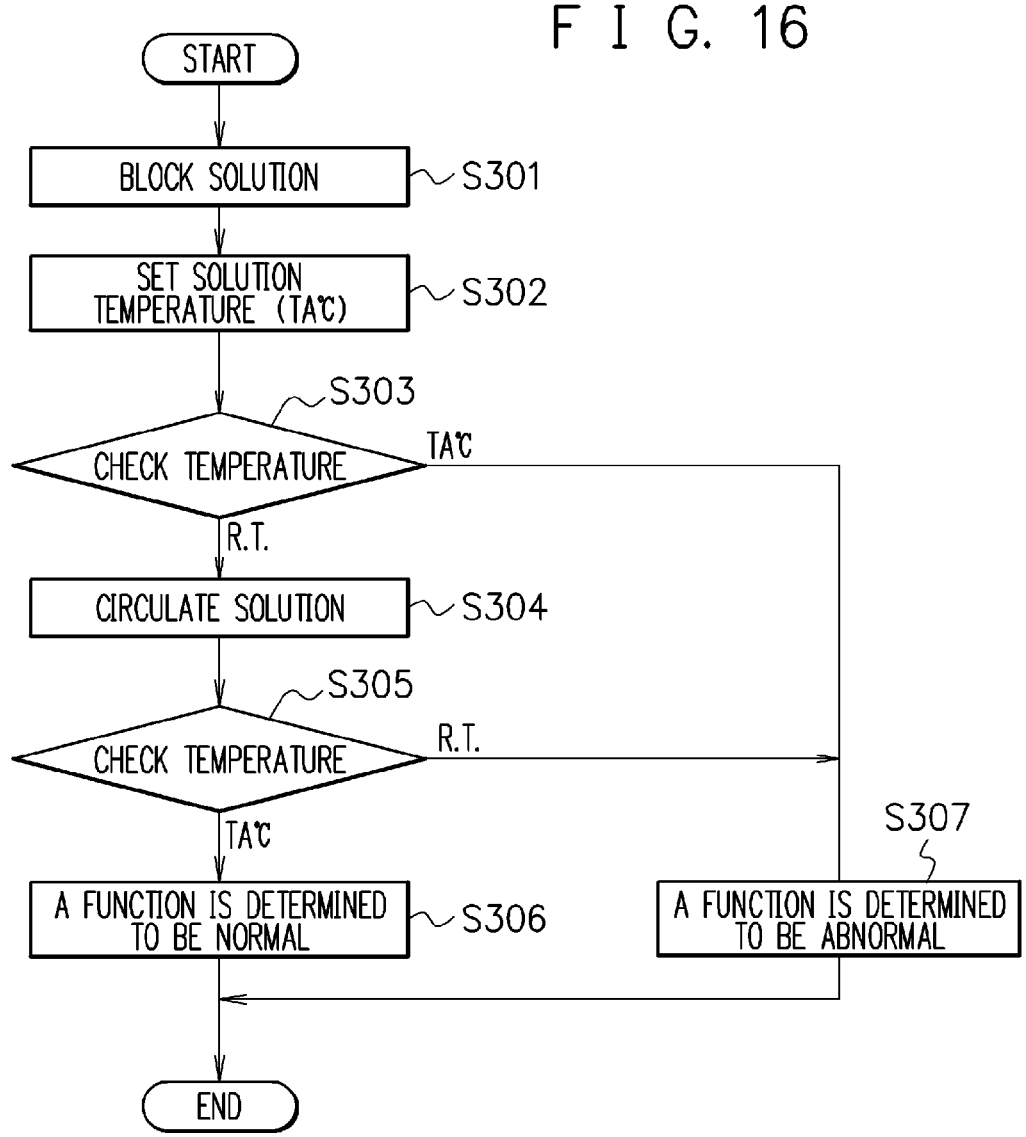
FIG. 16 is a flow chart depicting a function check operation of the testing device in the embodiment.
Figure 17:
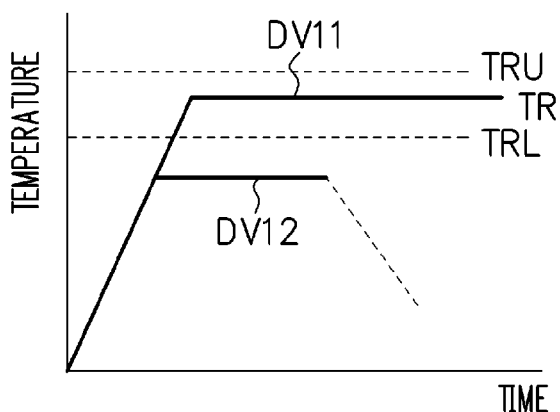
FIG. 17 is a view for explaining an example of temperature control in a testing device of semiconductor devices.

Further, it is also possible to provide an operation check function as depicted by a flow chart in FIG. 16 to the testing device of the semiconductor devices in the embodiment.

FIG. 16 is the flow chart depicting a function check operation of the testing device in the embodiment, and depicts, as an example, an operation to check whether or not a function of switching to circulate or block the solution, namely, the channel switching mechanism is normally operated.

Firstly, when the operation is started, the channel control section 22 in the temperature controller 20 controls, based on the control instruction from the controller 10, the channel switching mechanisms to close the connection paths between the solution pipe for making the solution circulate through the testing device and the solution pipe for making the solution pass through the thermal head (S301).

The solution temperature control section 21 in the temperature controller 20 controls, based on the control instruction from the controller 10, the heat exchanger so that the solution temperature is set at TA° C. (S302).

Next, the controller 10 obtains, under the state in which the channel switching mechanisms are controlled to close the connection paths between the solution pipe for making the solution circulate through the testing device and the solution pipe for making the solution pass through the thermal head, a temperature (heating amount) of the semiconductor device detected by the temperature detector 30 to check the temperature of the semiconductor device (S303).

As a result of this, when the temperature of the semiconductor device is a room temperature (atmospheric temperature in the testing device), the controller 10 determines that a blocking function in the channel switching mechanism is not abnormal. Subsequently, the channel control section 22 in the temperature controller 20 controls, based on the control instruction from the controller 10, the channel switching mechanisms to connect the solution pipe for making the solution circulate through the testing device and the solution pipe for making the solution pass through the thermal head so that the solution may be flown though the pipes (S304).

Next, the controller 10 obtains, under the state in which the channel switching mechanisms are controlled to connect the solution pipe for making the solution circulate through the testing device and the solution pipe for making the solution pass through the thermal head so that the solution may be flown through the pipes, a temperature (heating amount) of the semiconductor device detected by the temperature detector 30 to check the temperature of the semiconductor device (S305).

As a result of this, when the temperature of the semiconductor device is TA° C. (solution temperature), the controller 10 determines that a circulating function in the channel switching mechanism is not abnormal, ultimately determines that the channel switching mechanism is normally operated (S306), and terminates the operation.

When the temperature of the semiconductor device is TA° C. as a result of the check in step S303, or when the temperature of the semiconductor device is the room temperature as a result of the check in step S305, the controller 10 determines that the switching between the circulation and the blocking in the channel switching mechanism is not normally operated, ultimately determines that the channel switching mechanism is abnormal (S307), and terminates the operation.

Further, in like manner, it is also possible to check whether or not the function of switching the solutions flown through the thermal head and a shift control function of the thermal head in the longitudinal direction (switching function to bring/not to bring the solution temperature transmitting sheet into contact with the semiconductor device) are normally operated, by appropriately switching the states, detecting the temperature of the semiconductor device in each state, and determining whether or not the temperature is appropriate.

The above-described embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

According to any of the embodiments, even if a variation in heating amounts is large, by conducting control in accordance with the heating amounts, it is possible to favorably control temperatures of semiconductor devices and to control the temperatures of the semiconductor devices to fall within a range of a regulated temperature regardless of a difference in the heating amounts of the semiconductor devices. Therefore, it is possible to simultaneously perform a test on the semiconductor devices on which screening has performed again or which have been handled as defective products in the past, resulting that a test efficiency and a non-defective ratio may be improved.

Any of the embodiments may provide a testing device and a testing method of semiconductor devices with which temperatures of the semiconductor devices are favorably controlled regardless of a difference in heating amounts of the semiconductor devices due to a manufacturing variation and the like.

According to any of the embodiments, it becomes possible to control temperatures of semiconductor devices to be test targets having a large variation in heating amounts due to a manufacturing variation and the like of the semiconductor devices to fall within a range of a regulated temperature, by switching a solution to a solution at a higher temperature or by blocking the flow of the solution with respect to a semiconductor device having a small heating amount whose heat is drawn and thus its temperature cannot reach the regulated temperature with such a solution temperature that controls a temperature of a semiconductor device having a large heating amount to fall within the range of the regulated temperature.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

What is claimed is:

1. A testing device of semiconductor devices, comprising:
   a temperature detector detecting temperatures of a plurality of semiconductor devices for each of the semiconductor devices; and
   a temperature control unit controlling the temperatures of the semiconductor devices based on a detection result of the temperature detector, wherein
   the temperature control unit comprises:
   thermal heads being provided for each of the semiconductor devices and cooling or heating the corresponding semiconductor device;
   a plurality of first solution pipes through which a plurality of solutions set to mutually different temperatures flow in a parallel manner;
   a second solution pipe branched from one of the first solution pipes, passing through the thermal head, and joining the one of the first solution pipes; and
   a channel switching part closing a path of the first solution pipe, and controlling so that the solution is flown to the second solution pipe, and switching, for each of the first solution pipes, whether or not to make the solution flown through the first solution pipe flow through the thermal head,
   wherein the channel switching part is provided for each of the thermal heads.

2. The testing device of the semiconductor devices according to claim 1, wherein
   the channel switching part makes one solution among the plurality of solutions flow through the thermal head.

3. The testing device of the semiconductor devices according to claim 1, wherein
   the channel switching part makes one solution among the plurality of solutions flow through the thermal head or blocks the flow of the solution through the thermal head.

4. The testing device of the semiconductor devices according to claim 1, wherein:
   the plurality of the first solution pipes are disposed on an outside of the thermal head; and
   the channel switching part is provided at a connection portion between the first solution pipe and the second solution pipe.

5. The testing device of the semiconductor devices according to claim 1, further comprising
   a temperature controller controlling a temperature of the solution flown through the first solution pipe in accordance with a detection result of the temperature detector.

6. The testing device of the semiconductor devices according to claim 1, wherein
   the channel switching part switches whether or not to make the solution flown through the first solution pipe flow through the thermal head only before a test.

7. The testing device of the semiconductor devices according to claim 1, wherein:
   the thermal head has a temperature transmitting member transmitting the temperature of the solution flown inside the thermal head and a heater heating the semiconductor device; and
   a temperature controller switching whether to bring both the temperature transmitting member and the heater into contact with the semiconductor device or to bring only the heater into contact with the semiconductor device.

8. The testing device of the semiconductor devices according to claim 7, wherein
   the temperature controller switching whether to bring both the temperature transmitting member and the heater into contact with the semiconductor device or to bring only the heater into contact with the semiconductor device, and controlling an output of the heater in accordance with a detection result of the temperature detector.

9. The testing device of the semiconductor devices according to claim 8, wherein
   the temperature controller performs the control only before a test.

10. The testing device of the semiconductor devices according to claim 1, wherein the temperature control of the semiconductor devices is performed for each of the semiconductor devices.

11. The testing device of the semiconductor devices according to claim 1, wherein
the temperature control of the semiconductor devices is performed for each test board on which the plurality of semiconductor devices are mounted.

12. The testing device of the semiconductor devices according to claim 1, wherein
the temperature control of the semiconductor devices is performed for each pair formed of a plurality of semiconductor devices or for each pair formed of a plurality of test boards on which the plurality of semiconductor devices are respectively mounted.

13. The testing device of the semiconductor devices according to claim 1, further comprising
an operation check function checking whether or not the testing device is normally operated.

14. A testing device of semiconductor devices, comprising:
a temperature detector detecting temperatures of a plurality of semiconductor devices for each of the semiconductor devices; and
a temperature control unit having thermal heads cooling or heating the semiconductor devices for each of the semiconductor devices and controlling the temperatures of the semiconductor devices based on a detection result of the temperature detector, wherein:
the thermal head has a temperature transmitting member transmitting a temperature of a solution flown inside the thermal head and a heater heating the semiconductor device; and
a temperature controller switching whether to bring both the temperature transmitting member and the heater into contact with the semiconductor device or to bring only the heater into contact with the semiconductor device; and
the temperature transmitting member is fixed to a first block of the thermal head and the heater is fixed to a second block of the thermal head, and the first block and the second block are independently adjusted shift amounts thereof.

15. The testing device of the semiconductor devices according to claim 14, wherein
the temperature controller switching, for each of the semiconductor devices, whether to bring both the temperature transmitting member and the heater into contact with the semiconductor device or to bring only the heater into contact with the semiconductor device.

16. The testing device of the semiconductor devices according to claim 14, wherein
the temperature controller switching whether to bring both the temperature transmitting member and the heater into contact with the semiconductor device or to bring only the heater into contact with the semiconductor device, and controlling an output of the heater in accordance with a detection result of the temperature detector.

17. A testing method of semiconductor devices in which a test is performed by controlling temperatures of a plurality of semiconductor devices mounted on a test board with a temperature control unit having thermal heads being provided for each of the semiconductor devices and cooling or heating the semiconductor device, a plurality of the first solution pipes through which a plurality of solutions set to different temperatures flow in a parallel manner, a second solution pipe branched from one of the first solution pipes passing through the thermal head and joining the one of the first solution pipe, and a channel switching part provided for each of the thermal heads, closing a path of the first solution pipe and controlling so that the solution is flown to the second solution pipe, the testing method, comprising:
detecting the temperatures of the semiconductor devices for each of the semiconductor devices; and
switching a channel by controlling the channel switching part for each of the thermal heads based on a detected temperature to make one solution among the plurality of solutions flow through the thermal head.

* * * * *